United States Patent [19]

Iga et al.

[11] Patent Number: 5,224,123
[45] Date of Patent: Jun. 29, 1993

[54] TRANSVERSAL EQUALIZER

[75] Inventors: Hiroyuki Iga; Masaki Nishikawa, both of Yokohama, Japan

[73] Assignee: Kabushiki Kaisha Toshiba, Kawasaki, Japan

[21] Appl. No.: 921,431

[22] Filed: Jul. 31, 1992

Related U.S. Application Data

[63] Continuation of Ser. No. 670,898, Mar. 18, 1991, abandoned.

[30] Foreign Application Priority Data

Mar. 19, 1990 [JP] Japan .................................. 2-70639

[51] Int. Cl.$^5$ .................. H03H 7/30; H04B 3/04
[52] U.S. Cl. .................. 375/14; 364/724.16; 364/724.2; 375/12
[58] Field of Search .................. 375/11, 12, 13, 14, 375/15; 333/18, 28 R; 364/724.16, 724.19, 724.2; 358/905

[56] References Cited

U.S. PATENT DOCUMENTS

| | | | |
|---|---|---|---|
| 3,597,541 | 8/1971 | Proakis et al. | 375/12 |
| 3,775,685 | 11/1973 | Eggimann et al. | 375/12 |
| 4,476,491 | 10/1984 | Murata et al. | 375/14 |
| 5,027,370 | 6/1991 | Schenk | 375/14 |

FOREIGN PATENT DOCUMENTS 0072247 2/1983 European Pat. Off. .
0072247 2/1983 Japan .

OTHER PUBLICATIONS

"Performance Evaluation of Selected Automatic Deghosting Systems for Television" S. Goyal et al.; IE3 Trans on CE vol. CE-26, Feb. 1980, pp. 100-120.

"Ghost Cancel Reference Signal Method", S. Takayama et al.; 1989 National Convention Record of the Institute of Television Engineers of Japan, 11-1 pp. 239-240.

"Ghost Clean System"; H. Iga et al.; ITEJ Technical Report vol. 13, No. 53, pp. 7-12, CE-89-9, Oct. 1989.

Primary Examiner—Curtis Kuntz
Assistant Examiner—Young Tse
Attorney, Agent, or Firm—Cushman, Darby & Cushman

[57] ABSTRACT

A transversal equalizer having first and second transversal filters, each including a plurality of adders and a set of multipliers, and each of which equalizes input sample values based on tap coefficients applied to the multipliers and outputs the resulting signal, a combining circuit in the second transversal filter for combining the output signal of the first transversal filter with the signal being processed in the second transversal filter and a switch which connects the first output signal from the first transversal filter to either the combining circuit of the second transversal filter or to the input of the second transversal filter.

6 Claims, 4 Drawing Sheets

TRANSVERSAL EQUALIZER

This is a continuation of application Ser. No. 07/670,898, filed on Mar. 18, 1991, which was abandoned upon the filing hereof.

FIELD OF THE INVENTION

The present invention relates generally to a transversal equalizer, and more particularly, to a transversal equalizer which is composed of recursive and non-recursive filters connected in series and is suited for real-time filter processing of input signals.

BACKGROUND OF THE INVENTION

In recent years, a GCR (ghost canceller reference) signal has been inserted in the vertical blanking period as the reference signal for de-ghosting in response to demands for high quality pictures in TV broadcasting. Transversal equalizers have been adopted by TV sets for cancelling ghost images through waveform equalization using the GCR signal.

Shown in FIG. 1 is a circuit diagram showing the transversal equalizer which is for real-time waveform equalization. The circuit shown in FIG. 1 is referred to in, for example, Shri Goyal et al., "Performance Evaluations of Selected Automatic Deghosting Systems for Television", "IEEE Transactions on Consumer Electronics", Vol. CE-26, pp. 100–120 (February 1980) and is called a 6-taps transversal equalizer.

An input signal is sampled every T seconds and this input sample value $X_i$ is applied to the input terminal 1. This input sample value $X_i$ is applied to the multipliers M1 through M6, respectively and multiplied by coefficients (hereinafter referred to as tap coefficients) C1 through C6.

Outputs of the multipliers M1 through M6 are applied to the adders A1 through A6, respectively. Outputs from the adders A1 through A6 are delayed by the delay units D1 through D6, respectively and applied to the output terminal 2 and the adders A1 through A5 in the next filter stage.

Further, the delay units D1 through D6 are driven by the clock CK with a period of T seconds, supplied through the input terminal 3, and output signals by delaying them by T seconds. At the output terminal 2, an output based on a tap coefficient appears and it is possible to equalize the transmission lines by setting the tap coefficient.

Further, signals from the preceding stage are input to the cascade input terminal 4. This signal is added to the output from the multiplier M6 in the adder A6.

Now assuming that an input sample value $X_i$ is $\delta$ function $\{\delta i\}$, its impulse response $\{\alpha i\}$ is $\alpha 1 = C1$, $\alpha 2 = C2, \ldots, \alpha 6 = C6$. As the length of a train of impulse responses is the same as the number of taps, a longer train of impulse responses is obtainable by increasing the number of taps. That is, a filtering time can be extended by increasing the number of taps.

The range of delay times in which ghosting can be cancelled by a GCR signal is 44.7 $\mu$s of the GCR signal width. See, for example, Susumu Takayama et al., "Deghosting Reference Signal System", "1989 National Convention Record of the Institute of Television Engineers of Japan", pp. 239–240.

As described above, the length of the filtering time is decided by the number of taps and the number of taps required to obtain the range of 44.7 $\mu$s delay time is expressed by 44.7 $\mu$s/T (clock period). Normally, the clock frequency in the TV signal digital processing is set at 4 times the chromatic sub-carrier frequency (14.31818 MHz) and the clock period T is 69.84 $\mu$s. That is, in the de-ghosting using GCR signal, as many as 640 taps are needed.

Transversal equalizers have normally been made in integrated circuits (IC) and with the advanced degree of integration, 64 taps have been integrated in a single chip like TF-IC adopted in Toshiba's ghost clean TV tuner (TT-GC9).

Shown in FIG. 2 is a block diagram showing a conventional transversal equalizer which has adopted such transversal equalizers. See, the example, "Ghost Image Reducing Tuner and its Operation", Japanese magazine "Chroma", pp. 48–51, (December 1989).

A video signal subjected to disturbance by a ghost image is input to the input terminal 5. In this input video signal a GCR signal has been inserted.

The input video signal is input to the input terminal 6 of the transversal equalizer. The cascade input terminal 7 of the transversal filter 11 is connected to the reference potential point. Further, the input terminals 6 and 7 correspond to the input terminals 1 and 4 shown in FIG. 1.

To respective taps, not shown, of 64 multipliers of the transversal filter 11, tap coefficients C-29 and C0 are applied, respectively. Further, subscripts of the tap coefficients indicate which delay time of clock period T they correspond to.

The coefficient of the main tap corresponding to the rise of the GCR signal is C0. C0 is set for 1 and other tap coefficients for 0 at the time of initialization. Therefore, in the state of initialization, the transversal filter 11 directly outputs the video signal input to the input terminal 6 to the output terminal 8.

This transversal filter 11 is of the non-recursive type and constructed to the range of delay times from $-2 \mu$s (pre-ghost) to 2.4 $\mu$s (delayed-ghost) by the tap weight factors C-29 through C34. That is, cancellation of waveform distortion (waveform equalization) and cancellation of ghost in short delay times (nearby-ghost) are performed by the transversal filter 11.

The output from the transversal filter 11 is applied to the output terminal 10 through the subtractor 9 and at the same time, to the delay unit 21 from the output terminal 10.

The output of the delay unit 21 is applied to the input terminal 6 of each of the transversal filters 12 through 20 in the same construction as the transversal filter 11. The number of taps of the transversal filters 12 through 20 is 64 and tap coefficients C35 through C610 are applied to the transversal filters 12 through 20. That is, the transversal filters 12 through 20 correspond to delayed-ghosts for delay times 2.4 $\mu$s through 42.6 $\mu$s.

Outputs of the transversal equalizers 20 and 12 are applied through each cascade input terminal 7 of the transversal filters 19 through 12 in the next stage from respective output terminals 8, to the subtractor 9, thus forming the recursive filter.

The coefficients C35 through C610 are set at 0 in the initial state and when tap coefficients are corrected thereafter, a ghost cancelling signal is output from the transversal equalizer 12. The subtractor 9 output a deghosted video signal to the output terminal 10 after subtracting the ghost cancelling signal from the output of the transversal filter 11.

Tap coefficients C-29 through C610 are obtained through operation of the GCR signal extracted from input/output video signals and reference signal and are successively corrected at specified time intervals. That is, the GCR signal contained in the video signal from the input terminal 5 and the GCR signal contained in the video signal from the output terminal 10 are extracted. The GCR signal contained in the output video signal is compared with a reference signal to get an error signal and further, correlated operation of this error signal with the GCR signal contained in the input video signal is carried out and tap coefficients are corrected to minimize the error signal.

Further, as described above, the same ICs are used for the transversal filters 11 through 20 from the viewpoint of cost.

As described above, waveform equalization and nearby-ghost image removal are performed by the non-recursive transversal filter 11 and long distant ghost and secondary ghost (see the above-mentioned magazine, "Chroma") produced by this transversal filter 11 are removed by the recursive transversal filters 12 through 20.

Series connection of the non-recursive and recursive transversal equalizers is the construction best suited for removal of ghost image as shown in the above-mentioned "Chroma".

Generally, as to pre-ghost images, if pre-ghost images of delay time less than 2 μs are removed, there will be no problem in practical use. On the other hand, the delay time of delayed-ghost image may sometimes become more than 40 μs.

Since the range of ghost image removable delay time is 44.7 μs as described above, the corresponding range of pre-ghost image was set at $-2$ μs in the example shown in FIG. 2. That is, tap coefficients of the transversal filter 11 are from C-29, through C0 to C34.

The circuit is of such a construction that output of the transversal filter 11 and the transversal equalizer 12 are subtracted in the subtractor 9 to remove ghost image components and outputs of the transversal filters 11 and 12 are delayed by T on time base and the delay unit 21 operates at the delay time 34T.

It is, however, considered that with the advancement of integration of digital IC, the number of taps that can be integrated in a single chip will further increase in the future. If so, the number of taps for delayed-ghost images of the transversal filter 11 will be increased.

In this case, therefore, it becomes also necessary to extend the delay time (the number of delay taps) of the delay unit 21 corresponding to the increase in the number of taps in order to delay the time base of outputs of the transversal filters 11 and 12 by T. This will increase the size of the circuit and its cost.

In the conventional transversal equalizer described above there was the problem that it becomes necessary to increase the delay time of the delay unit and the circuit size becomes large, with a corresponding increase in the number of taps in a single chip.

SUMMARY OF THE INVENTION

It is, therefore, an object of the present invention to provide a transversal equalizer which is able to reduce the circuit size without requiring a delay unit even when the series connection of recursive and non-recursive transversal equalizers is adopted.

In order to achieve the above object, a transversal equalizer according to one aspect of the present invention includes first and second transversal filters, each including a plurality of adders and a set of multipliers, and each of which equalizes input sample values based on tap coefficients applied to the multipliers and outputs the resulting signal, a combining circuit in the second transversal filter for combining the output signal of the first transversal filter with the signal being processed in the second transversal filter and a switch which connects the first output signal from the first transversal filter to either the combining circuit of the second transversal filter or to the input of the second transversal filter.

Additional objects and advantages of the present invention will be apparent to persons skilled in the art from a study of the following description and the accompanying drawings, which are hereby incorporated in and constitute a part of this specification.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
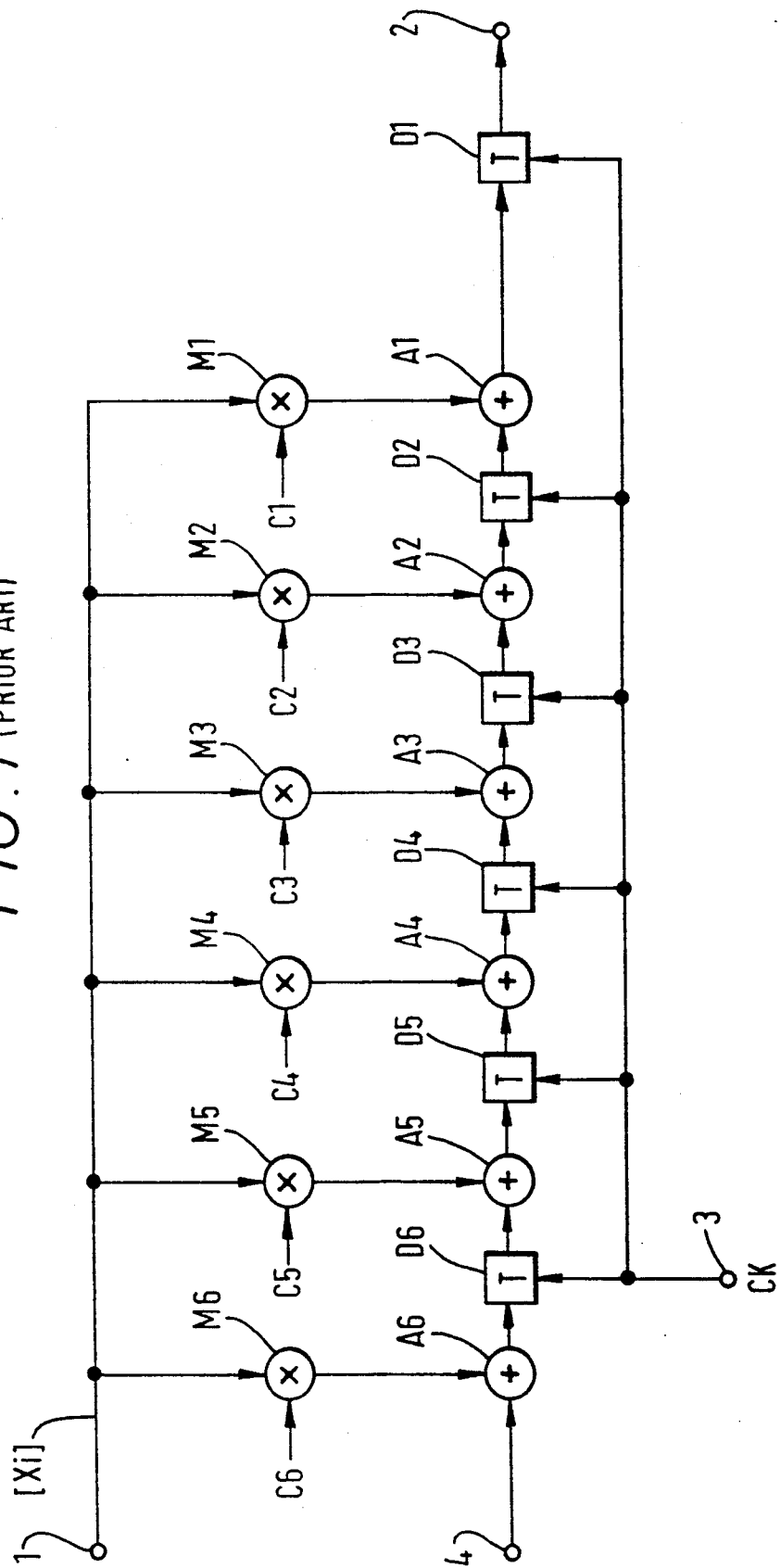
FIG. 1 is a circuit diagram showing a conventional transversal filter.

The present invention will be described in detail with reference to the FIGS. 3 and 4. Throughout the drawings, reference numerals or letters used in FIGS. 1 and 2 will be used to designate like or equivalent elements for simplicity of explanation.

Figure 3:
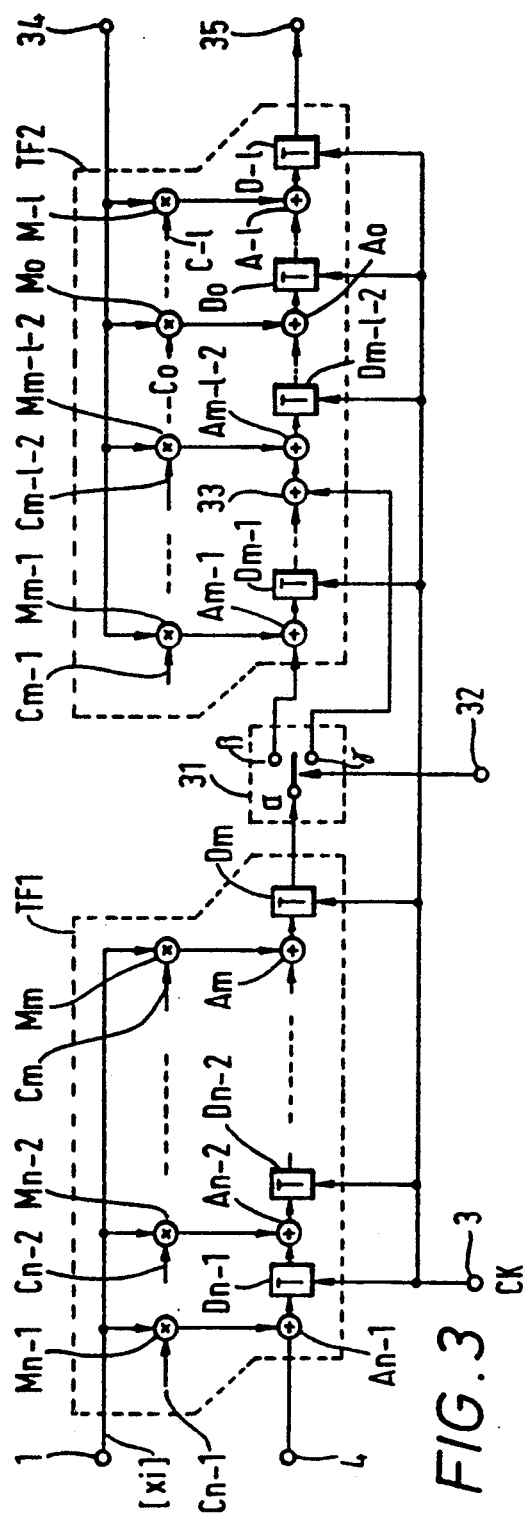
FIG. 3 is a circuit diagram showing one embodiment of the transversal equalizer according to the present invention.

Referring now to FIG. 3, a first embodiment of the transversal equalizer according to the present invention will be described in detail. FIG. 3 is a circuit diagram showing an embodiment of the transversal equalizer according to the present invention.

Figure 2:
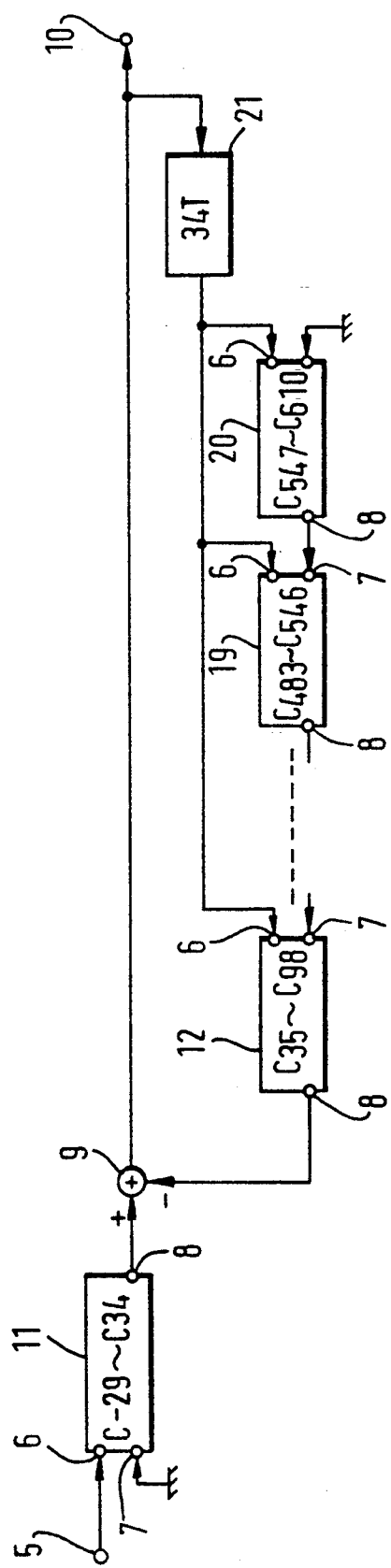
FIG. 2 is a circuit diagram showing a conventional deghosting apparatus using the transversal filter of FIG. 1.

The input weighting type transversal filter TF1 enclosed with a broken line is the same construction as the transversal equalizer shown in FIG. 1. That is, input sample value Xi is input to the input terminal 1 and this input sample value Xi is applied to the multipliers $Mm-Mn-1$ having $(n-m)$ taps, where n and m are natural numbers satisfying $n-1>m$. To the multipliers Mm through $Mn-1$, tap coefficients Cm through $Cn-1$ are applied, respectively.

The multipliers Mm through $Mn-1$ multiply the input sample value Xi with tap coefficients Cm through $Cn-1$ and give the results to the adders Am through $An-1$. Outputs from the adders Am through An-1 are applied to the delay units Dm through $Dn-1$, respectively. The delay units Dm through $Dn-1$ output input signals to the terminal α of the switch 31 and the adders Am through $An-2$ by delaying them by time T. Thus, the adders Am through $An-2$ add up to delay outputs of the multipliers $Mm+1$ through $Mn-1$ in the preceding stage and output them. Further, to the cascade terminal 4, the output of the transversal equalizer at the preceding stage (not shown) is supplied.

The output of the transversal filter TF1 is applied to the terminal $\alpha$ of the switch 31. The switch 31 selects the terminal $\alpha$ or $\gamma$ according to a control signal from the input terminal 32. These terminals $\beta$ and $\gamma$ operate as the cascade input terminals of the transversal filter TF2.

The transversal filter TF2 is in nearly the same construction as the transversal filter TF1 and the transversal filter TF2 has $(m+1)$ units of the multipliers $M-1$ through $Mm-1$, delay units $D-1$ through $Dm-1$ and $(m+1+1)$ units of adders $A-1$ through $Am-1$ and combiner 33. The signal from the terminal $\beta$ of the switch 31 is applied to the adder $Am-1$. Further, l is a natural number.

The input sample value Xi is input to the applied terminal 34. This input sample value Xi is applied to the multipliers $M-1$ through $Mm-1$. Outputs of these multipliers $M-1$ through $Mm-1$ are applied to the adders $A-1$ through $Am-1$ and outputs of the adders $A-1$ through $Am-1$ are applied to the adders in the next stage through the delay units $D-1$ through $Dm-1$ in the same way as in the transversal filter TF1. The transversal filter TF2 is provided with the combiner 33 between the delay unit $Dm-1-1$ and the adder $Am-1-2$. This combiner 33 adds the output of the delay unit $Dm-1-1$ and signal from the terminal $\gamma$ of the switch 31 and outputs the result of the adder $Am-1-2$. Output of the delay unit $D-1$ is output to the output terminal 35.

Further, the subscripts of elements of the transversal filters TF1 and TF2 show how many clock periods of delay they correspond to. For instance, tap coefficient C0 shows a coefficient which is multiplied to the main signal when the transversal filter TF2 is connected so as to be non-recursive.

A pre-ghost cancelling signal is generated by l piece of tap coefficients $C-1-1$ through $C-1$ applied to the multipliers $M-1$ through $M-1$. The post ghost cancelling signal is generated by $(m-1)$ pieces of tap coefficients $Cm-1$ through C1 applied to the multipliers $Mm-1$ through M1.

When non-recursive and recursive filters are to be connected in series in the embodiment in this construction, the input signal is applied to the input terminal 34 and at the same time, the output terminal 35 is to be connected to the input terminal 1. Thus, output from the output terminal is fed back to the input terminal 1.

The transversal equalizer TF2 performs waveform equalization of the input signal based on tap coefficients $C-1$ through $Cm-1$ and outputs the signal from the output terminal 35. The multipliers $M-1$ through $M-1$ correspond to, for instance, pre-ghost and the coefficient M1 through $Mm-1$ correspond to near-by and delayed ghost.

In this case, the transversal filter TF2 is in non-recursive construction. Output from the output terminal 35 is fed back to the input terminal 1 and the transversal filter TF1 generates a delayed-ghost cancelling signal based on tap coefficients Cm through $Cn-1$. Output of the transversal filter TF1 is applied to the combiner 33 of the transversal filter TF2 through the terminals $\alpha$ and $\gamma$ of the switch 31.

Since the combiner 33 is arranged just before the adder $Am-1-2$, total delay amount from the adder 33 (the terminal $\gamma$ of the switch 31) to the output terminal 35 is $(m-1)T$. Therefore, there is a delay of time T on the time base between the last tap coefficient $Cm-1$ of the transversal filter TF2 and the first tap coefficient Cm of the transversal filter TF2.

Thus, the transversal filter TF1 is formed in a recursive structure to enable waveform equalization and ghost image removal by a series connection of non-recursive and recursive filters.

On the other hand, the transversal filters TF1 and TF2 become the same type of filter with $n+1$ taps, when the switch 31 selects the terminal $\beta$.

Figure 4:
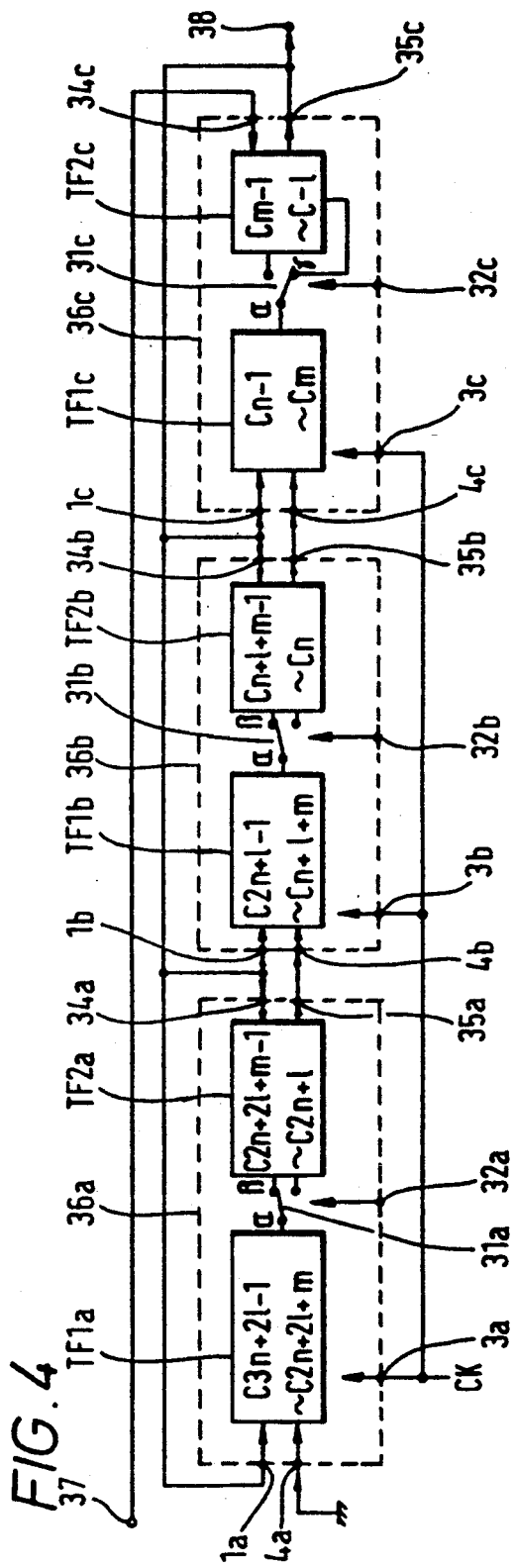
FIG. 4 is a circuit diagram showing an embodiment of the transversal equalizer shown in FIG. 3 applied to a deghosting apparatus.

Shown in FIG. 4 is a circuit diagram showing an embodiment of the transversal equalizer according to the present invention applied to a deghosting apparatus. In this embodiment, equalizer ICs 36a, 36b are the same construction as the transversal equalizer shown in FIG. 3, and are used by connecting in series.

The number of taps $(n+1)$ of the transversal equalizer ICs 36a, and 36b is 214 and the total number of taps is 642. Further, l, m and n are, for instance, $l=29$, $m=35$, and $n=185$. The switches 31a and 31b of the transversal equalizer ICs 36a and 36b select the terminal $\beta$ and the switch 31c of the transversal equalizer IC 36c selects the terminal $\gamma$. To the input terminal 37 a video signal is input. This video signal is applied to the multipliers of the transversal filter TF2c through the input terminal 34c of the transversal equalizer IC 36c.

Outputs from the multipliers of the transversal filter TF2c are added to delay signals from the multipliers up to the preceding stage and output to the next stage. Thus, the transversal filter TF2c removes pre-ghost and nearby-ghost components based on tap coefficients and outputs the video signal from the output terminal 35c.

This video signal is led out to the output terminal 38 and at the same time, applied to the input terminals 1a and 34a of the transversal equalizer IC 36a, the input terminals 1b and 34b of the transversal equalizer IC 36b and the input terminal 1c of the transversal equalizer IC 36c.

The cascade input terminal 4a of the equalizing TC 36a is connected to the reference potential point. The transversal filter TF1a has an output based on tap coefficients applied to the multipliers to the transversal filter TF2a through the terminals $\alpha$ and $\beta$ of the switch 31a.

The output of the transversal filter TF2a is output to the cascade input terminal 4b of the transversal equalizer IC through the output terminal 35a. The output of the transversal filter TF1b is applied to the transversal filter TF2b through the terminals $\alpha$ and $\beta$ of the switch 31b and output of the transversal filter TF2b is applied to the transversal filter TF1c through the output terminal 35b and the cascade input terminal 4c of the transversal equalizer IC 36c.

The output of the transversal filter TF1c is applied to the transversal filter TF2c through the terminals $\alpha$ and $\gamma$ of the switch 31c. Further, the input terminals 32a through 32c shown in FIG. 4 correspond to the input terminals 3 and 32 shown in FIG. 3.

In the embodiment described above, tap coefficients $C-1$ through $Cn-1$ are applied to the taps of the transversal equalizer IC 36c. Tap coefficients Cn through $Cn+m+1-1$ are applied to the taps of the transversal filter TF2b of the transversal equalizer IC 36b and tap coefficients $Cn+m+1$ through $C2n+1-1$ are applied to the taps of the transversal filter TF1b.

Further, tap coefficients $C2n+1$ through $C2n+m+2l-1$ are applied to the taps of the transversal filter TF2a of IC36a and tap coefficients C2n+m+2l through C3n+2l−1 are applied to the taps of the transversal filter TF1a.

The output of the transversal filter TF2c is formed in a non-recursive constitution. If the period of clock CK is 69.84 μs, ghost image of delay time −2.0 μs between 2.4 μs is removed by the transversal filter TF2c.

This output is applied to the equalizer ICs 36a and 36b and the transversal filter TF1c all acting as recursive filters. Thus, the transversal equalizer ICs 36a and 36b and the transversal filter TF1c remove ghosting of delay times between 2.4 μs and 42.7 μs.

As described above, in this embodiment the transversal filter TF2c is formed in non-recursive construction to remove pre-ghost and nearby-ghost, and the transversal filters TF1a, TF2a, TF1b, TF2b and TF1c are composed in recursive construction to removing distant (delayed) ghosts.

Since the output of the transversal filter TF1c is applied to the combiner 33 of the transversal filter TF2c, tap coefficient Cm−1 of the transversal filter TF2c and tap coefficient Cm of the transversal filter TF1c become adjacent to each other on the time base and delay unit 21 of the prior art is not required.

Further, a case where the number of taps of equalizer IC is 214 has been explained above. When equalizer ICs having 320 taps are used, it is apparent that the transversal equalizer IC 36a and 36c only can be used eliminating the transversal equalizer IC 36b.

In the present invention, when the first transversal equalizer is to be formed in a non-recursive construction and the second transversal equalizer in a non-recursive construction, output from the first transversal equalizer is applied to the adding means and output from the second transversal equalizer is applied to the first transversal equalizer as an input signal by the switch.

When the adding means adds the output of a multiplier at a position based on the delay amount of the delay unit group to the output of the first transversal equalizer, the last tap coefficient of the second transversal equalizer will be adjacent to the first tap coefficient of the first transversal equalizer on the time base.

Thus, differing from conventional transversal equalizers, it is possible to construct a recursive transversal equalizer requiring no delay unit.

As described above, the present invention can provide an extremely preferable transversal equalizer.

While there have been illustrated and described what are at present considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation or material to the teaching of the present invention without departing from the central scope thereof. Therefore, it is intended that the present invention not be limited to the particular embodiment disclosed as the best mode contemplated for carrying out the present invention, but that the present invention include all embodiments falling within the scope of the appended claims.

What is claimed is:

1. A transversal equalizer comprising:
    a first transversal filter comprising a first input means for receiving a first equalizer input signal, a plurality of multiplier means, coupled in parallel to said first input means, for respectively multiplying said first equalizer input signal by predetermined coefficients, a plurality of adder means respectively coupled to outputs of said multiplier means for adding said outputs of said multiplier means, a plurality of delay means coupled to outputs of respective adder means for delaying outputs thereof, a cascade input means coupled to a first of said adder means of said first transversal filter for receiving a cascade equalizer input signal and a first output means coupled to a last of said delay means for outputting a first output signal;
    a second transversal filter comprising a second input means for receiving a second equalizer input signal or said first equalizer input signal, a plurality of multiplier means, coupled in parallel to said second input means, for respectively multiplying said second equalizer input signal by predetermined coefficients, a plurality of adder means respectively coupled to outputs of said multiplier means for adding said outputs of said multiplier means, a plurality of delay means coupled to outputs of respective adder means for delaying outputs thereof, an equalizer output means coupled to a last delay means for outputting an equalizer output signal and a second cascade input means and third cascade input means for inputting a cascade input signal, said second cascade input means being coupled to a first adder means of said second transversal filter, said third cascade input means being coupled to a combining means for adding a cascade input signal to a signal being processed in said second transversal filter, said combining means being coupled to an adder means of said second transversal filter other than said first adder means; and
    a switch means for connecting said first output signal from said first transversal filter to either said second cascade input means or said third cascade input means of said second transversal filter.

2. A transversal equalizer as in claim 1, wherein said switch means further comprises an external control means for externally controlling the connection of said first output means to said second cascade input means or said third cascade input means.

3. A transversal equalizer as claimed in claim 1, wherein said first transversal filter is recursive and said second transversal filter is configurable as either recursive or non-recursive.

4. A transversal equalizer as claimed in claim 3, wherein said second transversal filter is configured as recursive when said second input means receives said first equalizer input signal and said switch means connects said first output signal of said first transversal filter to said second cascade input means of said second transversal filter.

5. A transversal equalizer as in claim 3, wherein said second transversal filter is configured as non-recursive when said second input means receives said second equalizer input signal and said switch means connects said first output signal from said first transversal filter to said third cascade input means of said second transversal filter and said first equalizer input signal is said equalizer output signal.

6. A transversal equalizer comprising:
    a first transversal filter comprising a first input means for receiving a first equalizer input signal, a plurality of multiplier means, coupled in parallel to said first input means, for respectively multiplying said first equalizer input signal by predetermined coefficients, a plurality of adder means respectively coupled to outputs of said multiplier means for adding said outputs of said multiplier means, a plurality of delay means coupled to outputs of respective adder means for delaying outputs thereof, a cascade input means coupled to a first of said adder means of said first transversal filter for receiving a cascade equalizer input signal and a first output means coupled to a last of said delay means for outputting a first output signal;

a second transversal filter comprising a second input means for receiving a second equalizer input signal of said first equalizer input signal, a plurality of multiplier means, coupled in parallel to said second input means, for respectively multiplying said second equalizer input signal by predetermined coefficients, a plurality of adder means respectively coupled to outputs of said multiplier means for adding said outputs of said multiplier means, a plurality of delay means coupled to outputs of respective adder means for delaying outputs thereof, an equalizer output means coupled to a last delay means for outputting an equalizer output signal and a second cascade input means and third cascade input means for inputting a cascade input signal, said second cascade input means being coupled to a first adder means of said second transversal filter, said third cascade input means being coupled to a combining means for adding a cascade input signal to a signal being processed in said second transversal filter, said combining means being coupled to an adder means of said second transversal filter other than said first adder means; and a switch means for connecting said first output signal from said first transversal filter to either said second cascade input means or said third cascade input means of said second transversal filter, wherein said first transversal filter comprises a larger number of multiplier means than said second transversal filter.

* * * * *